United States Patent [19]

Sato et al.

[11] Patent Number: 4,568,849
[45] Date of Patent: Feb. 4, 1986

[54] DRIVING CIRCUIT FOR PIEZOELECTRIC BI-MORPH

[75] Inventors: Ryuichi Sato; Tsutomu Taniguchi; Masatoshi Ohba, all of Kyoto, Japan

[73] Assignee: Omron Tateisi Electronics Co., Kyoto, Japan

[21] Appl. No.: 646,453

[22] Filed: Aug. 31, 1984

[30] Foreign Application Priority Data

Sep. 1, 1983 [JP] Japan .......................... 58-136240[U]

[51] Int. Cl.$^4$ ........................................... H01L 41/08
[52] U.S. Cl. .................................... 310/316; 310/317; 310/332; 200/181
[58] Field of Search ........................ 310/314, 316–319, 310/330–332; 200/181

[56] References Cited

U.S. PATENT DOCUMENTS 2,195,417  4/1940  Mason ............................. 310/317 X
4,093,883  6/1978  Yamamoto .......................... 310/317
4,233,637 11/1980  Kubota ........................... 310/332 X

FOREIGN PATENT DOCUMENTS 719006  9/1965  Canada ............................... 310/317

Primary Examiner—Mark O. Budd
Attorney, Agent, or Firm—Wegner & Bretschneider

[57] ABSTRACT

A driving circuit for driving a piezoelectric bi-morph constituted by joining a pair of piezoelectric elements so that their polarization axes are directed in directions opposite to each other. The driving circuit includes a driving power source, a first switch portion through which a common junction of the pair of piezoelectric elements is connected to one side of the driving power source, with the other terminal of one piezoelectric element being connected to the other side of the driving power source, and a second switch portion to which the other terminal of the other piezoelectric element is connected.

1 Claim, 4 Drawing Figures

DRIVING CIRCUIT FOR PIEZOELECTRIC BI-MORPH

BACKGROUND OF THE INVENTION

The present invention generally relates to an electrical circuitry and more particularly, to a driving circuit for a piezoelectric bi-morph.

Owing to the fact that a piezoelectric bi-morph is a sort of capacitor, in a conventional circuit merely arranged to turn a voltage to be applied to the piezoelectric bi-morph from an on state to an off state for bringing the piezoelectric bi-morph from the one state to the off state, it takes a certain period of time in order to reduce a deflection or displacement D of the piezoelectric bi-morph to zero as shown in a dotted line in FIG. 1. Therefore, there is such a disadvantage that the piezoelectric bi-morph can not be applied to a driving device such as a relay or the like in which contacts are subjected to repeated on and off states in a short period of time.

SUMMARY OF THE INVENTION

Accordingly, an essential object of the present invention is to provide a driving circuit for a piezoelectric bi-morph, which is capable of restoring the piezoelectric bi-morph to an original state by rapidly reducing an amount of displacement thereof upon turning off a driving power source, with a substantial elimination of disadvantages inherent in the conventional circuits of this kind.

Another important object of the present invention is to provide a driving circuit for a piezoelectric bi-morph of the above described type, which is simple in construction and stable in functioning at high reliability.

In accomplishing these and other objects, according to one preferred embodiment of the present invention, there is provided a driving circuit for a piezoelectric bi-morph constituted by joining a pair of piezoelectric elements so that polarization axes thereof are directed in directions opposite to each other. The driving circuit includes a driving power source, a first switch means through which a common junction of the pair of piezoelectric elements is connected to one side of the driving power source, with the other terminal of one piezoelectric element being connected to the other side of said driving power source, and a second switch means to which the other terminal of the other piezoelectric element is connected, whereby said second switch means is turned off when said first switch means is turned on, and said second switch means is turned on upon turning off of said first switch means so as to drive the other piezoelectric element by a voltage of said one piezoelectric element.

By the arrangement according to the present invention as described above, an improved driving circuit for a piezoelectric bi-morph has been advantageously presented.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
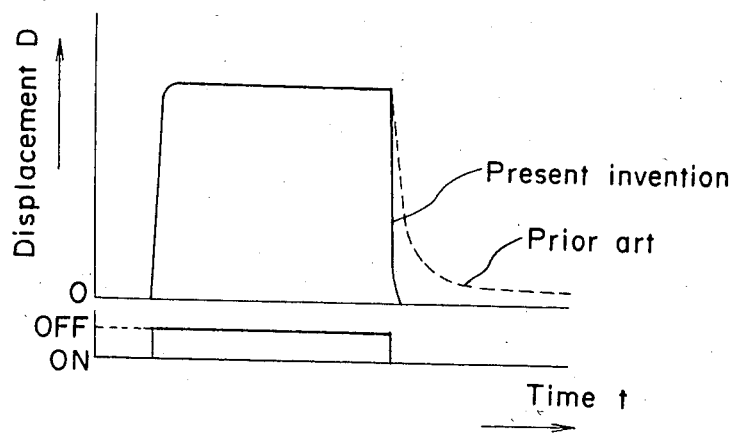
FIG. 1 is a graph showing the relation between displacement of a piezoelectric bi-morph with respect to impressed voltages and time.

Before the description of the present invention proceeds, it is to be noted that like parts are designated by like reference numerals throughout the accompanying drawings.

Figure 2:
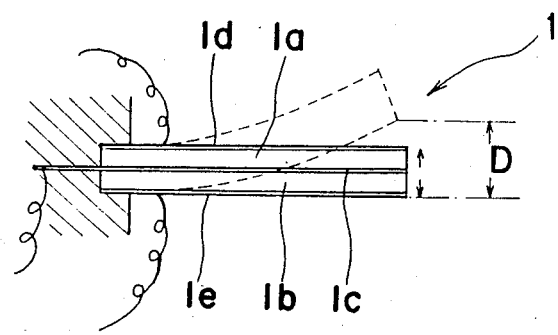
FIG. 2 is a schematic diagram showing one example of a piezoelectric bi-morph which may be applied to the present invention.

Referring now to FIG. 2, showing one example of a piezoelectric bi-morph 1 which may be applied into a driving circuit of the present invention, the piezoelectric bi-morph 1 includes two or a pair of piezoelectric elements 1a and 1b which are laminated on opposite sides of an intermediate electrode plate 1c, with axes of polarization of said piezoelectric elements 1a and 1b in thicknesses being directed in directions opposite to each other as indicated by arrows in FIG. 2.

Figure 3:
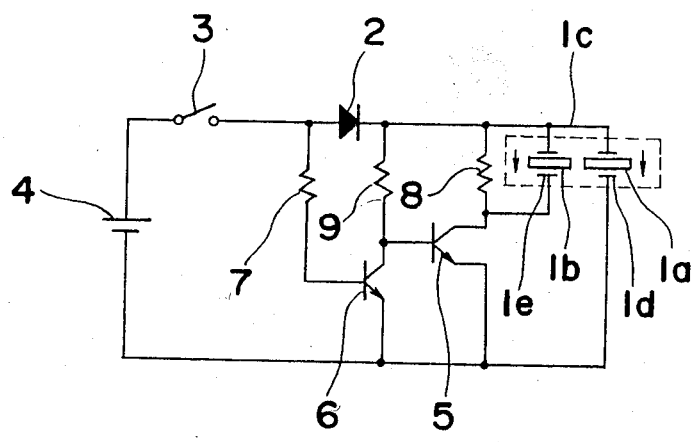
FIG. 3 is an electrical circuit diagram showing a driving circuit for a piezoelectric bi-morph according to one preferred embodiment of the present invention.

In FIG. 3, showing a construction of a diving circuit for a piezoelectric bi-morph according to one preferred embodiment of the present invention, a common junction (i.e., the intermediate electrode plate 1c) is connected to one terminal of a DC power source 4 through a diode 2 and a power switch 3 which serves as a first switch, while the other terminal 1d of the piezoelectric element 1a is connected to the other terminal of the DC power source 4.

Meanwhile, the other terminal 1e of the piezoelectric element 1b is connected to the other terminal of the DC power source 4 through the collector and emitter of a transistor 5 which constitutes a second switch, while the base of the transistor 5 is coupled to the collector of the transistor 6, with the base of said transistor 6 being connected to the power switch 3 through a resistor 7. The collectors of the transistors 5 and 6 are respectively connected to the diode 2 through resistors 8 and 9.

By the above circuit arrangement, when the power switch 3 is in the on state, the transistor 6 is turned on, with the transistor 5 being turned off, and no voltage is impressed to the piezoelectric element 1b. On the contrary, since a voltage is applied to the piezoelectric element 1a, the piezoelectric bi-morph 1 is to be deflected by an amount of displacement D.

Subsequently, upon turning off of the power switch 3, the transistor 6 is turned off, while the transistor 5 is turned on by the voltage charged in the piezoelectric element 1a for voltage impression to the piezoelectric element 1b so that a deflection takes place in a direction opposite to the displacement of the piezoelectric element 1a as described above. In other words, the deflected piezoelectric element 1a is accelerated in its restoration by the deflection of the piezoelectric element 1b, and the displacement of the piezoelectric bi-morph 1 is rapidly reduced to zero as shown in a solid line in FIG. 1. Thus, when the charging voltage for the piezoelectric element 1a becomes zero, the transistor 5 is turned off.

Figure 4:
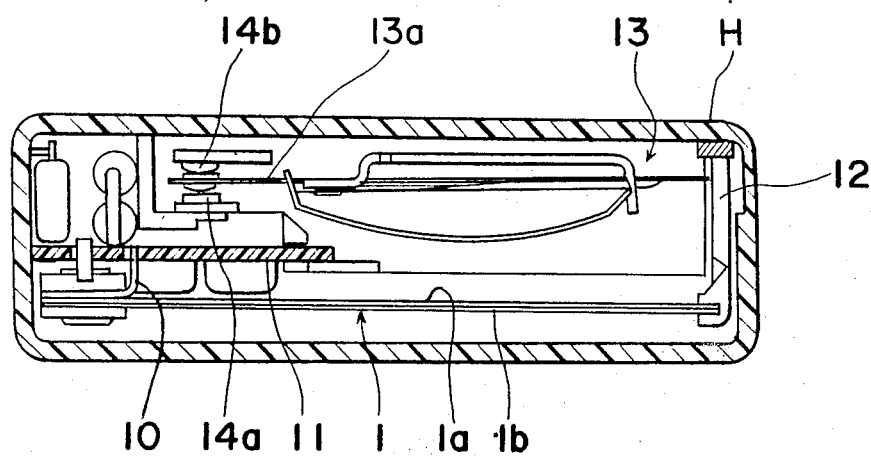
FIG. 4 is a side sectional view of a relay in which the driving circuit according to the present invention may be incorporated.

Referring to FIG. 4, there is shown a relay in which the driving circuit according to the present invention may be incorporated. The relay of FIG. 4 generally includes a casing H, the piezoelectric bi-morph 1 mounted to a printed circuit board 11 within the casing H through a support member 10, a switch portion 13 including a movable piece 13a, etc. disposed between fixed contacts 14a and 14b, and a driving member 12 as illustrated.

The arrangement of FIG. 4 has such an advantage that, since the terminal at one side of the piezoelectric element can be directly connected to the DC power source, the piezoelectric bi-morph 1 is readily fixed to the printed circuit board 11 through the support member 10 secured to the electrode at one side of the piezoelectric element and simultaneously serving as an external terminal.

As is clear from the foregoing description, according to the present invention, since it is so arranged that the piezoelectric bi-morph is constituted by laminating the two piezoelectric elements, with the polarization axes thereof directed in the opposite directions, while the switch means is provided for one of said piezoelectric elements so as to turn on said switch means upon turning off of the power source for connecting the respective piezoelectric elements in a parallel relation to each other, whereby upon turning off of the power source, the other piezoelectric element is forcibly restored by the charging voltage of the one piezoelectric element. Accordingly, it is possible to rapidly restore the piezoelectric bi-morph in its displacement, with a consequent improvement on the response characteristic of the piezoelectric bi-morph.

Meanwhile, owing to the fact that voltages are impressed to the respective piezoelectric elements in the same direction as the direction of the polarization axes, deterioration of the piezoelectric bi-morph is appreciably reduced.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A driving circuit for a piezoelectric bi-morph constituted by joining a pair of piezoelectric elements so that polarization axes thereof are directed in directions opposite to each other, said driving circuit comprising a driving power source, a first switch means through which a common junction of the pair of piezoelectric elements is connected to one side of the driving power source, with the other terminal of one piezoelectric element being connected to the other side of said driving power source, and a second switch means to which the other terminal of the other piezoelectric element is connected, whereby said second switch means is turned off when said first switch means is turned on, and said second switch means is turned on upon turning off of said first switch means so as to drive the other piezoelectric element by a voltage of said one piezoelectric element.

* * * * *